United States Patent [19]

Skovmand

[11] Patent Number: 4,888,505
[45] Date of Patent: Dec. 19, 1989

[54] VOLTAGE MULTIPLIER COMPATIBLE WITH A SELF-ISOLATED C/DMOS PROCESS

[75] Inventor: Timothy J. Skovmand, San Jose, Calif.

[73] Assignee: National Semiconductor Corporation, Santa Clara, Calif.

[21] Appl. No.: 189,442

[22] Filed: May 2, 1988

[51] Int. Cl.[4] ..................... H03K 17/687; H03K 3/26
[52] U.S. Cl. .................................... 307/571; 307/579; 307/296.8; 307/529; 307/501; 307/304
[58] Field of Search ..................... 307/296.8, 451, 576, 307/579, 529, 501, 499, 110, 107, 304, 571

[56] References Cited

U.S. PATENT DOCUMENTS

| Re. 32,526 | 10/1987 | Hochstein | 307/571 |
|---|---|---|---|
| 3,824,447 | 7/1974 | Kuwabara | 307/110 |
| 4,599,555 | 7/1986 | Damiano et al. | 307/571 |
| 4,603,269 | 7/1986 | Hochstein | 307/571 |
| 4,616,303 | 10/1986 | Mauthe | 307/110 |
| 4,649,289 | 3/1987 | Nakano | 307/571 |

Primary Examiner—Stanley D. Miller
Assistant Examiner—Richard Roseen
Attorney, Agent, or Firm—Gail W. Woodward; Lee Patch

[57] ABSTRACT

A CMOS structure is employed to create an isolated large area power output transistor along with a voltage multiplier that acts to develop an overdrive bias in response to clock pulses. The circuit can be employed to couple a relatively low power supply voltage to an output terminal while encountering a small voltage drop across the power transistor.

3 Claims, 1 Drawing Sheet

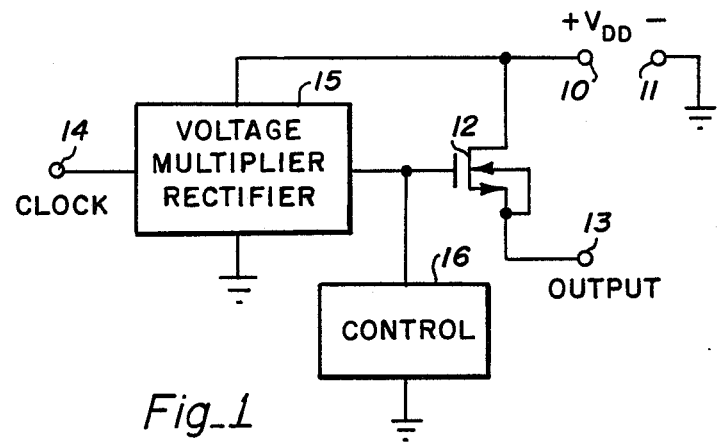
Fig_1
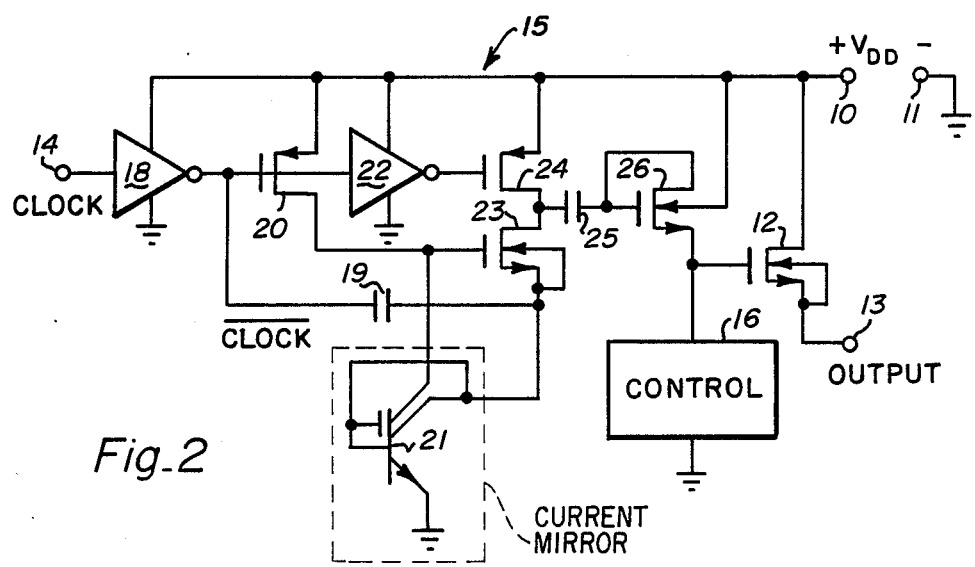
Fig_2
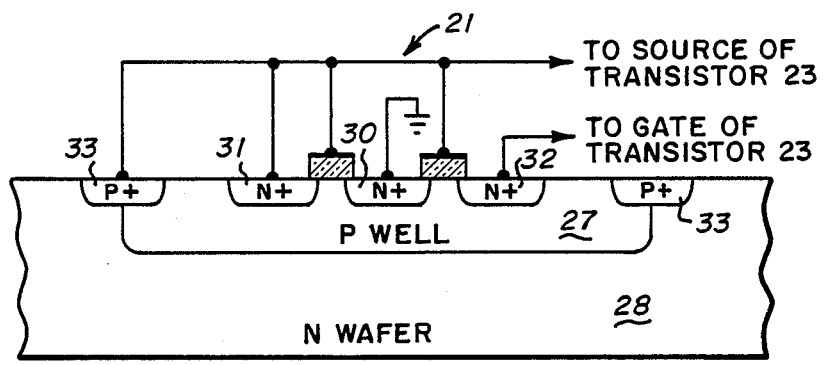
Fig_3

VOLTAGE MULTIPLIER COMPATIBLE WITH A SELF-ISOLATED C/DMOS PROCESS

BACKGROUND OF THE INVENTION

A high power diffused metal oxide semiconductor (DMOS) transistor typically has a threshold voltage of about 2-3 volts. Such devices are often employed as switches or control elements. In what is called a high-side driver application the power transistor drain is connected to the power supply line and the source, which provides the output potential, is brought to a potential level very close to that of the power supply. To do so requires that the gate must be driven above the power supply voltage by well over a threshold voltage. It has been found that an output driver N channel DMOS transistor requires a gate overdrive of 5 to 10 volts. When one considers that a commonly used supply voltage is 5 volts, it can be seen that the gate drive should be a multiple thereof.

The invention is intended for use in connection with complementary metal oxide semiconductor (CMOS) structures. Here N-channel and P-channel MOS transistors are combined on a common silicon substrate. In the so-called P-well construction an N-type common substrate has P-channel transistors created therein. P-type wells diffused into the substrate are employed to contain the N-channel transistors.

Alternatively, a P-type substrate can contain the N-channel transistors and N-type wells are diffused therein. The N-wells then contain P-channel transistors. In either case, the transistors contained in the wells are isolated from the others by virtue of the well-to-substrate junction.

SUMMARY OF THE INVENTION

It is an object of the invention to employ a CMOS voltage multiplier rectifier operated from a clock pulse source to develop a d-c bias that can be used to bias a power output transistor.

It is a further object of the invention to over drive the gate of a diffused large area power output CMOS transistor by means of a voltage tripler rectifier operated from a clock pulse source.

These and other objects are achieved in a preferred embodiment that includes a P-well CMOS structure designed to operate from a 5-volt power supply. The power output transistor is a large area, N-channel self-isolated DMOS device. A 5-volt peak-to-peak clock pulse is present. The clock pulses are peak-rectified and employed to charge a first capacitor. The opposite phase of the clock pulses are employed to charge a second capacitor in a voltage doubling configuration. The second capacitor is coupled by way of a clocked N-channel transistor to the gate of the power output transistor where the gate capacitance comprises the third capacitor which is charged to a level that represents the output of a voltage tripler. Thus, the output transistor gate can be biased at a level almost three times that of the power supply. This provides adequate overdrive even when operated from a 5-volt supply. It is to be understood that while the preferred embodiment employs a voltage tripler, a voltage doubler or voltage quadrupler could be employed depending upon the voltages involved.

BRIEF DESCRIPTION OF THE DRAWING

FIG. 1 is a block diagram showing the basic elements of the invention.

FIG. 2 is a schematic diagram of a preferred voltage tripler rectifier in accordance with the invention.

FIG. 3 is a cross-section of a semiconductor wafer showing the construction of the bipolar transistor shown in FIG. 2.

DESCRIPTION OF THE INVENTION

The basic elements of the invention are shown in block-diagram form in FIG. 1. The circuit is operated from a $V_{DD}$ power supply connected + to terminal 10 and − to ground terminal 11. Typically, this will be a 5-volt supply. Output transistor 12 couples a portion of the $+V_{DD}$ supply to output terminal 13. If transistor 12 is to be turned on fully its gate will have to be over-driven in the positive direction by typically 2 or 3 volts. An overdriven capability of 10 to 15 volts has been found to be desirable. This is accomplished by rectifying the system clock signal at terminal 14 in a rectifier 15 of the multiplying variety. In the preferred embodiment 15 will be a voltage tripler rectifier. In a system operated from a 5-volt supply, which employs 5-volt peak-to-peak clock pulses, the tripler will produce an output slightly under 15 volts which will be capable of fully turning transistor 12 on. Control element 16 will sink current from the voltage tripler and pull the voltage down to a desired level. This means that the voltage at terminal 13 can be controlled from a level close to $V_{DD}$ to any desired lower value.

FIG. 2 is a schematic diagram of a preferred voltage tripler rectifier 15. The clock pulses at terminal 14 are coupled through an inverter buffer 18 to one end of capacitor 19, the gate of transistor 20 and the input of inverter 22. The other end of capacitor 19 is coupled to the base and one collector of transistor 21, shown inside the dashed outline labeled "current mirror", and the source and back gate of transistor 23. When the clock pulses out of inverter buffer 18 are high, capacitor 19 will charge to the clock positive peak less the $V_{BE}$ of transistor 21. The charging current will flow into the lower collector of transistor 21 which functions as a current mirror. Thus, transistor 21 will conduct when the clock pulses are high. For this condition, transistor 20 will be off and the second or upper collector of transistor 21 will pull the gate of transistor 23 low and turn it off. The same clock phase coupled through inverter 22 will pull the gate of transistor 24 low and thus turn it on. This will couple the left-hand end of capacitor 25 to the $V_{DD}$ line. The right-hand end of capacitor 25 is coupled through transistor 26, acting as a source follower, to the gate of transistor 12.

On the opposite clock pulse excursion the clock is low, thus pulling the left-hand end of capacitor 19 close to ground. This action turns transistor 21 off and transistor 20 on. Inverter 22 will turn transistor 24 off for this clock phase. Conduction in transistor 20 will pull the gate of transistor 23 up so as to turn it on. This couples the right hand end of capacitor 19 to the left hand end of capacitor 25, which is thereby driven to a negative potential. Since the right hand end of capacitor 25 is coupled to transistor 26 it will charge towards a potential of twice $V_{DD}$. While it may take several clock pulse cycles, the potential at the gate and collector of transistor 26 will rise well above $V_{DD}$ and the charge on capacitor 25 will approach $2V_{DD}$. When transistor 23 is on the two capacitors are effectively coupled in series and, via transistor 26, will act to charge the gate capacitance of transistor 12 to close to $3V_{DD}$. Thus, a voltage tripler action is produced.

Transistor 21 is a critical element of the invention because its collector and base will be operated below ground during the negative clock excursions. Thus, these electrodes are biased outside the power supply span. FIG. 3 is a cross section of that portion of a CMOS wafer that contains transistor 21. In the drawing the metallization or wiring is shown schematically. However, the gate oxide is portrayed under the gate electrode. This clearly defines the pair of side by side N channel CMOS transistors that make up transistor 21 which is fabricated into a CMOS P well 27 that is located in an N type wafer 28. P+ ring 33 surrounds the P well 27 and overlaps its edge so as to provide an ohmic connection to the P well. The two N channel transistors include a common source 30 that is grounded. This source acts as the emitter for the parasitic bipolar transistor 21. Drain 31 becomes a lateral bipolar collector that is coupled to P well connection 33 which forms the lateral bipolar transistor base contact. These electrodes are also connected to the N channel transistor gates as shown. Drain 32 provides the second lateral transistor collector. It can be seen that if either of the bipolar transistor collectors 31 or 32 are operated below ground, the associated PN junction will be reverse biased and therefore nonconductive. The associated N channel transistor will be biased off so it too will be nonconductive.

The circuit shown results in a voltage tripler which supplies the required gate overdrive for an N channel power output transistor and is based upon P well CMOS construction. It can be seen that a P well acts to isolate the output transistor from the semiconductor wafer. Clearly, a similar construction using N well CMOS could be achieved. In such a case a power output P channel transistor would have its drain connected to a negative supply potential. Here all of the device structures would be complemented and the bipolar lateral transistor would be a dual collector PNP device.

The invention has been described and is operation detailed. When a person skilled in the art reads the foregoing description, alternatives and equivalents, within the spirit and intent of the invention, will be apparent. Accordingly, it is intended that the scope of the invention be defined only by the claims that follow.

I claim:

1. A CMOS circuit having an output terminal and power supply terminals connectable to an operating power supply, said circuit comprising:
    a large area output transistor of a first conductivity type, having its source and drain electrodes coupled between said output terminal and one of said power supply terminals and having a gate electrode;
    a source of clock pulse signals;
    a current mirror having input and output terminals;
    a first capacitor coupled between said source of clock pulse signals and said current mirror input;
    a first transistor having said first conductivity type and having its source and backgate terminals coupled to said current mirror input, its gate terminal coupled to said current mirror output and having a drain terminal;
    a second transistor having an opposite conductivity type and having its drain coupled to said gate of said first transistor, its source terminal returned to said one of said power supply terminals and its gate terminal coupled to said source of clock pulses;
    a first inverter having an input coupled to said source of clock pulse and having an output terminal;
    a third transistor having said opposite conductivity type and having its drain electrode coupled to said drain of said first transistor, its source electrode returned to said one of said power supply terminals and its gate terminal coupled to said first inverter output;
    a second capacitor having a first terminal coupled to said drain of said first transistor and having a second terminal;
    a fourth transistor having said first conductivity type and having its gate and drain terminals coupled to said second terminal of said second capacitor, its back gate coupled to said one of said power supply terminals and its source terminal coupled to said gate terminal of said large area output transistor whereby said gate of said large area output transistor is operable at a bias potential than can substantially exceed that of said operating power supply; and
    means for controlling the magnitude of said bias potential.

2. The CMOS circuit of claim 1 wherein said current mirror comprises a dual collector lateral parasitic bipolar transistor.

3. The CMOS circuit of claim 2 wherein said dual collector lateral parasitic bipolar transistor has a current mirror input comprising one collector which is connected to its base and the other collector comprises the current mirror output.

* * * * *